(12) United States Patent  
Mizutani et al.

(10) Patent No.: US 8,284,807 B2
(45) Date of Patent: Oct. 9, 2012

(54) WAVELENGTH-TUNABLE LASER APPARATUS AND WAVELENGTH CHANGING METHOD THEREOF

(75) Inventors: Kenji Mizutani, Tokyo (JP); Kenji Sato, Tokyo (JP); Koji Kudo, Tokyo (JP)

(73) Assignee: NEC Corporation, Tokyo (JP)

( * ) Notice: Subject to any disclaimer, the term of this patent is extended or adjusted under 35 U.S.C. 154(b) by 41 days.

(21) Appl. No.: 12/865,779

(22) PCT Filed: Dec. 9, 2008

(86) PCT No.: PCT/JP2008/072298
§ 371 (c)(1),
(2), (4) Date: Aug. 2, 2010

(87) PCT Pub. No.: WO2009/101742
PCT Pub. Date: Aug. 20, 2009

(65) Prior Publication Data
US 2011/0002349 A1    Jan. 6, 2011

(30) Foreign Application Priority Data
Feb. 15, 2008  (JP) ................................ 2008-034536

(51) Int. Cl.
*H01S 3/10* (2006.01)
*H01S 3/13* (2006.01)
*H01S 3/00* (2006.01)

(52) U.S. Cl. .................... 372/20; 372/29.015; 372/38.07

(58) Field of Classification Search .................... 372/20, 372/29.015, 29.016, 29.023, 38.07
See application file for complete search history.

(56) References Cited

U.S. PATENT DOCUMENTS
2007/0258494 A1* 11/2007 Davies et al. .................... 372/20
2007/0280306 A1* 12/2007 De Gabory et al. ............. 372/20

FOREIGN PATENT DOCUMENTS

| | | |
|---|---|---|
| JP | 7-111354 A | 4/1995 |
| JP | 11-87827 A | 3/1999 |
| JP | 2001242500 A | 9/2001 |
| JP | 2003298177 A | 10/2003 |
| JP | 2005204195 A | 7/2005 |
| WO | 2003001635 A | 1/2003 |
| WO | 2006008873 A | 1/2006 |

OTHER PUBLICATIONS

International Search Report for PCT/JP2008/072298 mailed Jan. 13, 2009.

* cited by examiner

*Primary Examiner* — Armando Rodriguez

(57) ABSTRACT

An object is to provide a wavelength-tunable laser apparatus that prevents a grid-hopping upon wavelength change, and a wavelength changing method thereof. A wavelength-tunable laser apparatus 101 according to the present invention includes a semiconductor optical amplifier 102 and a periodic wavelength-selection filter 106. Further, the wavelength-tunable laser apparatus 101 includes a phase control unit 111 that concurrently controls a current applied to the semiconductor optical amplifier 102 and a phase tuning of a wavelength-tunable laser under an open-loop control. Thus, dark-tuning can be achieved.

3 Claims, 6 Drawing Sheets

WAVELENGTH-TUNABLE LASER APPARATUS AND WAVELENGTH CHANGING METHOD THEREOF

TECHNICAL FIELD

The present invention relates to a wavelength-tunable laser apparatus applicable to an optical communication system, for example, and a wavelength changing method thereof.

BACKGROUND ART

At present, a wideband wavelength-tunable laser that can arbitrarily select a wavelength to be used and has a single light source has come into use in a WDM (Wavelength Division Multiplexing) optical communication system. The use of such a wideband wavelength-tunable laser can reduce the number of types of light sources. Therefore, the wideband wavelength-tunable laser can be manufactured in a small size and at a low cost. Recently, the WDM optical communication system using a ring topology has been developed to further improve the degree of freedom of the system. In this system, an arbitrary wavelength changing by a wavelength-tunable laser, like a RODAM (Reconfigurable Optical Add Drop Multiplexing) function, has come to be actively used.

However, in the case of using the wavelength-tunable laser in the WDM system, the laser has to satisfy two characteristics described below. First, high-precision wavelength control is required. The control precision of the laser oscillation wavelength has to satisfy the range of ±5% of the channel-spacing with respect to the standard-channel wavelength used in the system (hereafter, it is referred to as ITU-grid (International Telecommunication Union grid)). Second, it is required to change the laser wavelength without interference with the ITU-grid that is already used in the system when the laser wavelength is changed (it is called dark-tuning). In consideration of satisfying this characteristic, the use of a mode-hopping-free wavelength-tunable laser is the best, and the use of a wavelength-tunable laser capable of changing the oscillation wavelength into a desirable channel under the grid-hopping-free condition is the next best.

Wavelength-tunable laser modules having various structures are being developed to satisfy two characteristic-requirements described above. Patent Document 1 discloses a wavelength-tunable laser for tuning the laser oscillation wavelength into the ITU-grid by a filter having periodic transmission/reflection characteristics, thereby achieving high-precision wavelength control. An external cavity wavelength-tunable laser (ECTL) described in Patent Document 1 includes an etalon filter having a periodic transmission characteristic, a semiconductor optical amplifier (SOA) having phase control regions (PC regions) integrated therein, and a liquid-crystal wavelength-tunable mirror (LC mirror). The ETCL controls a peak reflection wavelength of the LC mirror and a phase of a resonator mode to be tuned into one of the periodic fixed peak transmission wavelengths of the etalon. The periodic peak wavelength of the etalon can be precisely tuned into the ITU-grid by adjusting the angle and temperature of the etalon.

However, there is a major problem in dark-tuning when a wavelength is changed in the wavelength-tunable laser described in Patent Document 1. It will be described below with reference to FIG. 6. FIG. 6 is a graph showing a time-variation comparison among an SOA current 601, a light output 602, an SOA active layer temperature 603, a phase shift 604 caused by a change in the SOA active layer temperature 603, and an oscillation wavelength 607 on the same time axis when the wavelength is changed.

As shown in FIG. 6, a wavelength-change is generally performed in (1) to (3) processes described below.
(1) A current applied to the SOA (the SOA current 601) is decreased down to 0 mA, and the light output 602 is turned off.
(2) A peak reflection wavelength is set at a desired wavelength by controlling a voltage of the LC mirror. At the same time, a current applied to the PC region (the PC current) is adjusted to a setting current (a current value whose mode is stabilized when the SOA current 601 becomes a desired driving value).
(3) The SOA current 601 is increased up to a driving-condition value (200 mA, for example), and the light output 602 is turned on.

The SOA current 601 is greatly changed (0 mA->200 mA) in the (1) to (3) processes described above. When the SOA current 601 is greatly changed, a large amount of the phase shift 604 is caused. If a phase is shifted by a half cycle ($\pi$) from an optimum condition due to the phase shift 604, a mode-hopping is caused in the oscillation wavelength 607. The mode-hopping is frequently associated with a grid-hopping. Therefore, some measure needs to be taken to achieve the dark-tuning.

Here, as shown in FIG. 6, the phase shift 604 is caused due to heat generation by the SOA current 601. The heat generation is proportional to about the square of the SOA current 601, and the SOA active layer temperature 603 is changed by the heat generation. A refractive index of a semiconductor optical amplifier region (an SOA region) is changed due to a thermo-optic effect of semiconductor caused by the change of the SOA active layer temperature 603 (a positive change of the refractive index). The change of the refractive index causes a phase variation, or the phase shift 604. In comparing a current of 200 mA to be regularly used with the large amount of the SOA current 601, as shown in FIG. 6, a large phase variation of $\pi$ or more is caused when the wavelength is changed. To solve the above-mentioned problem, Patent Document 2 proposes a method in which a wavelength changing value is extracted by a wavelength-monitoring structure prepared outside a laser, thereby controlling a wavelength by negatively feeding back the changing value.

[Patent Document 1] Japanese Unexamined Patent Application Publication No. 2005-204195
[Patent Document 2] Japanese Unexamined Patent Application Publication No. 7-111354

DISCLOSURE OF INVENTION

Technical Problem

However, even in the technology disclosed in Patent Document 2, there are problems such as an increase in size of an apparatus and a complicated negative feedback control.

The present invention has been made to resolve the problems described above. An object of the present invention is to provide a wavelength-tunable laser apparatus that prevents a grid-hopping upon wavelength change, and a wavelength changing method thereof.

Technical Solution

A wavelength-tunable laser apparatus according to the present invention includes a semiconductor optical amplifier, a periodic wavelength-selection filter, and a phase control unit that concurrently controls a current applied to the semiconductor optical amplifier and a phase tuning of a wavelength-tunable laser under an open-loop control.

A wavelength changing method of a wavelength tunable laser apparatus according to the present invention includes decreasing a light output by concurrently controlling a current applied to a semiconductor optical amplifier and a phase tuning of a wavelength tunable laser under an open-loop control, changing a wavelength by controlling a current applied to the semiconductor optical amplifier, and increasing the light output by concurrently controlling the current applied to the semiconductor optical amplifier and the phase tuning of the wavelength tunable laser under the open-loop control.

ADVANTAGEOUS EFFECTS

According to the present invention, it is possible to provide a wavelength-tunable laser apparatus that prevents a grid-hopping upon wavelength change, and a wavelength changing method thereof.

EXPLANATION OF REFERENCE

101 WAVELENGTH-TUNABLE LASER APPARATUS
102 SOA
103 PC REGION
104 AMPLIFICATION REGION
105 COLLIMATE LENS
106 ETALON FILTER
107 LC MIRROR
108 TEMPERATURE DETECTOR
109 SUB-CARRIER
110 TEMPERATURE CONTROLLER
111 CPU
112 MEMORY

BEST MODE FOR CARRYING OUT THE INVENTION

Hereinafter, concrete exemplary embodiments of the present invention will be closely described with reference to the drawings. However, the present invention is not limited to the exemplary embodiments described below. Further, the following descriptions and the drawings are arbitrarily simplified to clarify explanations.
First Exemplary Embodiment Next, exemplary embodiments of the present invention will be closely described with reference to the drawings.

Figure 1:
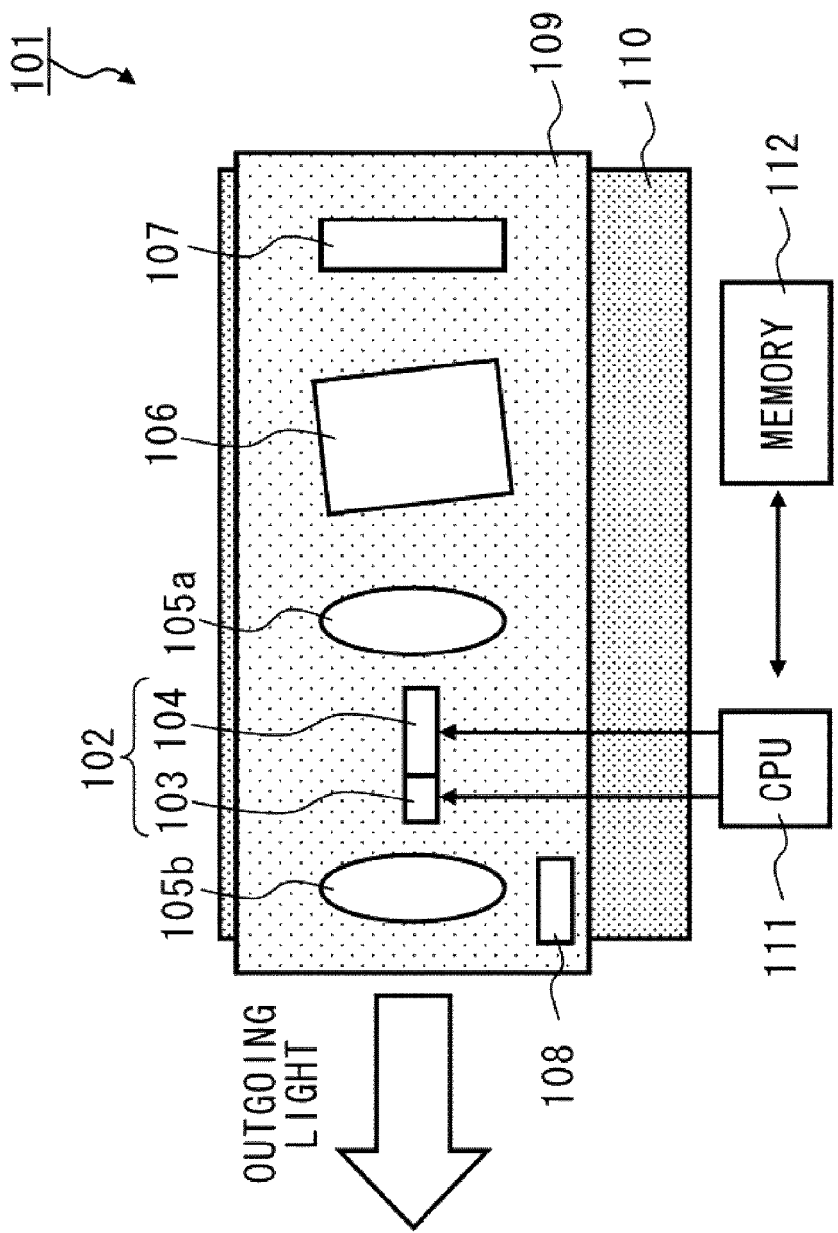
FIG. 1 shows a block diagram of a wavelength-tunable laser apparatus according to a first exemplary embodiment of the present invention.

FIG. 1 shows a block diagram of a wavelength-tunable laser apparatus 101 according to a first exemplary embodiment of the present invention. The wavelength-tunable laser apparatus 101 is a laser with an external resonator, for example. The wavelength-tunable laser apparatus 101 includes an SOA 102, a pair of collimate lenses 105a and 105b, an etalon filter 106, a liquid-crystal wavelength-tunable mirror (LC mirror) 107, a temperature detector 108, a sub-carrier 109, a temperature controller 110, a CPU 111, and a memory 112.

Figure 2:
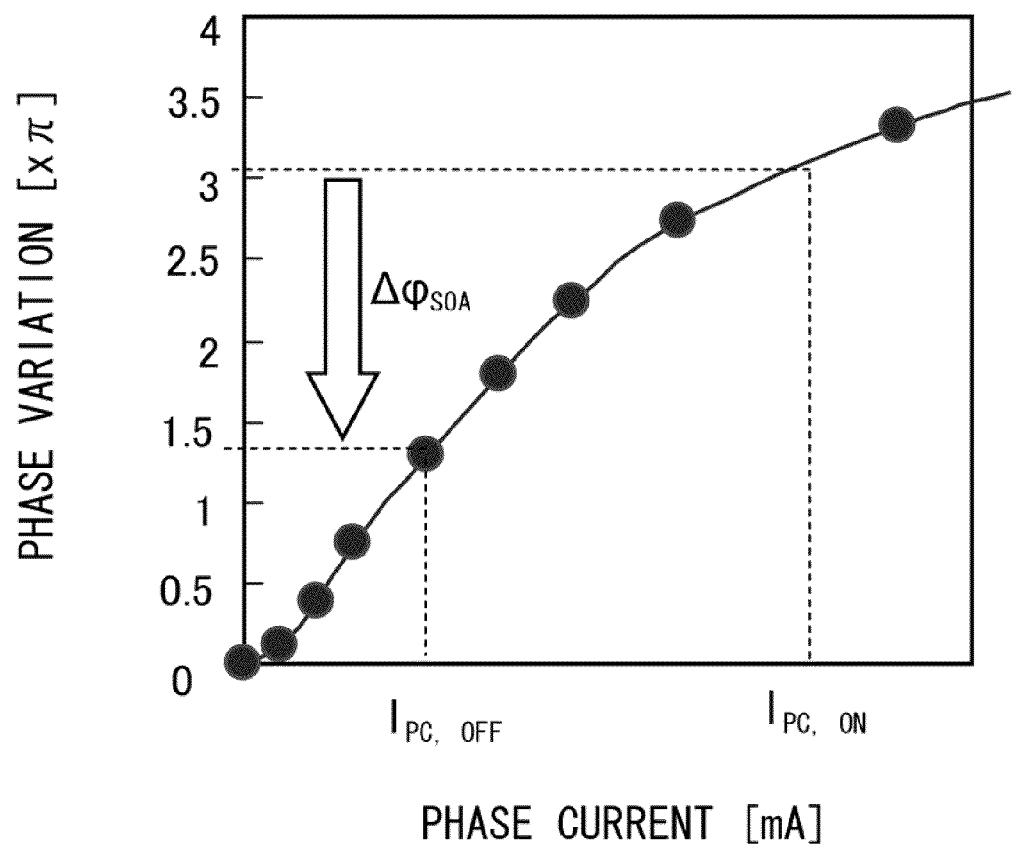
FIG. 2 shows a phase characteristic of a PC region.

Here, the SOA 102 includes a phase-control (PC) region 103 and an amplification region 104. This makes it possible to materialize a phase-control function. The amplification region 104 including active devices is composed of Multiple Quantum Well (MQW), which emits and amplifies light caused by a current injection. The PC region 103 is composed of a bulk composition having a band-gap on the side of a wavelength shorter than a laser oscillation wavelength. As shown in FIG. 2, the PC region 103 controls a phase due to a plasma effect using a negative change in a refractive index caused by a current injection. Downsizing of the wavelength-tunable laser is achieved by using integrated PC regions.

As shown in FIG. 1, a laser beam outgoing from the left end face of the SOA 102 is converted into parallel light by the collimate lens 105b and output in the wavelength-tunable laser apparatus 101 according to the present embodiment.

The collimate lens 105a is placed on an opposite side to a light output of the SOA 102. The collimate lens 105a converts a light beam outgoing from the right end face of the SOA 102 into parallel light.

The light beam parallelized by the collimate lens 105a is reflected by the LC mirror 107 and fed back to the SOA 102. The LC mirror 107 can change the peak reflection wavelength by changing the refractive index of the liquid-crystal by an applied voltage.

The etalon filter 106 is placed between the collimate lens 105a and the LC mirror 107. The etalon filter 106 has a periodic transmission characteristic with respect to a wavelength in the wavelength range to be used.

The SOA 102, the collimate lenses 105a and 105b, the etalon filter 106, and the LC mirror 107 described above are placed on the common sub-carrier 109 to make a light beam proceed linearly. The temperature detector 108 composed of a thermistor or the like is placed in an appropriate location on the sub-carrier 109. Further, the sub-carrier 109 is loaded onto the temperature controller 110. The sub-carrier 109 is controlled at a constant temperature by monitoring the temperature detected by the temperature detector 108.

In the memory 112, the value of a PC current IPC,ON when the light output is turned on and the value of a PC current IPC,OFF when the light output is turned off at respective channels are recorded. The CPU 111 is configured to be able to control an SOA current and a PC current at the same time based on the information recorded in the memory 112 when the wavelength is changed under an open-loop control.

Now, IPC,OFF can be estimated in advance by a method described below. At first, a periodic fluctuation component of the oscillation wavelength is evaluated from the SOA current dependency of the oscillation wavelength. A phase variation $\Delta\phi$SOA associated with an increase and decrease in current of the SOA 102 is estimated from the number of rotations during the period. Then, IPC,OFF is obvious from the relation between a phase current and a phase shift.

While only IPC,ON and IPC,OFF are recorded in the memory 112 according to the present embodiment, other information can be recorded. For example, coefficients of approximated curves obtained by approximating the SOA current dependency of ΔϕSOA and the relation shown in FIG. 2, respectively, can be recorded in the memory 112. In this case, even if the SOA current and the PC current in operating state are changed, IPC,OFF can be estimated by the CPU 111.

Figure 3:
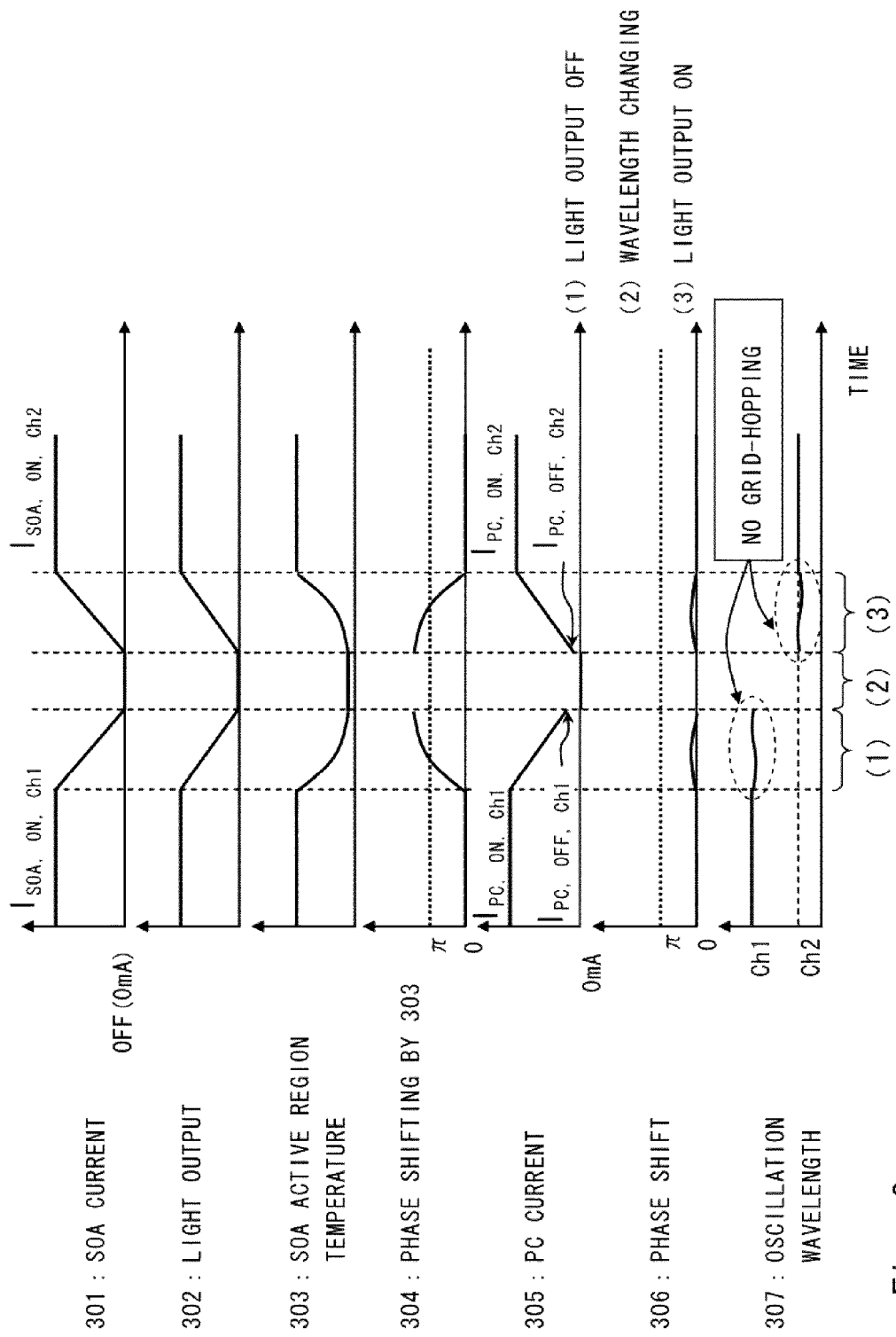
FIG. 3 is a graph showing changes of various parameters when a wavelength is changed in the wavelength-tunable laser apparatus according to the first exemplary embodiment of the present invention.
Figure 6:
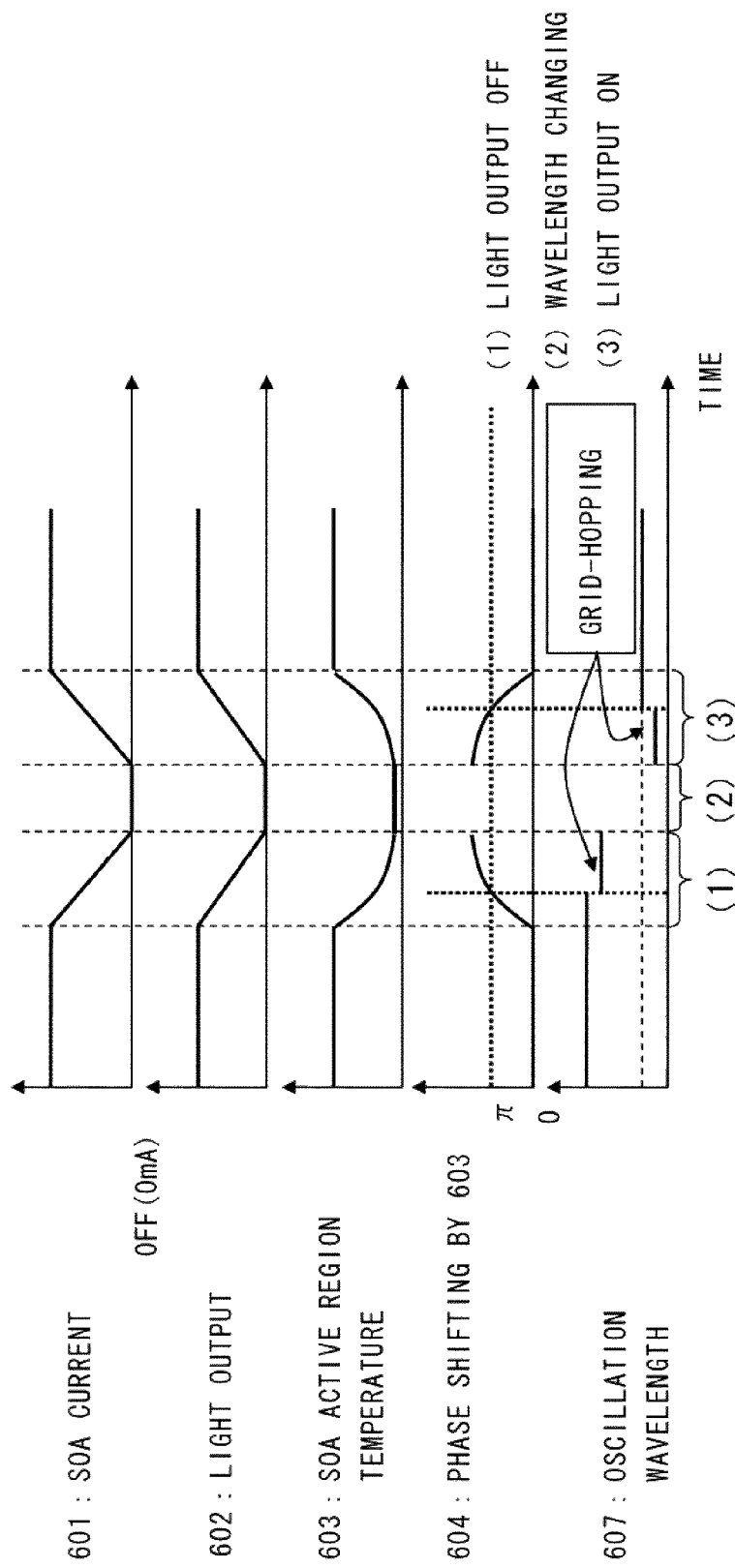
FIG. 6 is a graph showing changes of various parameters when a wavelength is changed in a wavelength-tunable laser apparatus according to the related art.

An operation according to the present exemplary embodiment will be described below with reference to FIG. 3. FIG. 3 is a graph showing a time-variation comparison among an SOA current 301, a light output 302, an SOA active layer temperature 303, a phase shift 304 caused by a change in the SOA active layer temperature 303, a PC current 305, a phase shift 306, and an oscillation wavelength 307 on the same time axis when the wavelength is changed. Here, the SOA current 301, the light output 302, the SOA active layer temperature 303, and the phase shifting 304 caused by a change in the SOA active layer temperature 303 in FIG. 3 correspond to an SOA current 601, a light output 602, an SOA active layer temperature 603, and a phase shifting 604 caused by a change in the SOA active layer temperature 603 in FIG. 6, respectively.

As shown in FIG. 3, a flow when the wavelength is changed from a channel-1 to a channel-2 in the wavelength-tunable laser apparatus 101 according to the first exemplary embodiment will be described below.

(1) Decreasing the Light Output -> OFF

The SOA current 301 is decreased from ISOA,ON,Ch 1 to 0 mA, and the light output 302 is turned off. At the same time, the PC current 305 is also decreased from IPC,ON,Ch1 to IPC,OFF,Ch1 with compensation for the phase shifting 304 caused by a change in the SOA active layer temperature 303.

(2) Wavelength Setting

The peak reflection wavelength of the LC mirror at the channel-2 is set up. Then, the PC current 305 is set up at IPC,OFF,Ch2.

(3) Increasing the Light Output -> ON

The SOA current 301 is increased up to ISOA,ON,Ch2, and the light output 302 is turned on. At the same time, the PC current 305 is also increased from IPC,OFF,Ch2 to IPC,ON, Ch2 with compensation for the phase shifting 304 caused by a change in the SOA active layer temperature 303.

The phase shift 306 obtained when the wavelength is changed is suppressed to π/2 or less by the flow described above. This makes it possible to prevent the grid-hopping of the oscillation wavelength 307. As well, the phase shift caused by the SOA current 301 has a response time on the order of milliseconds due to heat generation. Thus, a time resolution of a decrease and increase of the SOA current 301 (time resolution in each operating state of (1) and (3) described above) is set up at 1 millisecond. Then, the time to change the wavelength is about 10 seconds in the WDM communication system. Therefore, the total running time for each of (1), (2), and (3) is desirably in a range from 1 millisecond to 10 seconds.

Further, it is possible to precisely compensate for the phase and suppress the phase variation to π/10 or less by adjusting the PC current as described below.

At first, a time dependency of the phase variation when the SOA current temporally changes in a turn-on state and turn-off state of the light output is estimated.

Next, a time dependency of the value of the PC current that is necessary to compensate for the value of the phase variation is obtained from FIG. 2, and an approximated function thereof is recorded in the memory 112.

Then, when the wavelength is changed, the PC current is controlled based on the approximated function recorded in the memory 112.

Second Exemplary Embodiment

The phase control by a current injection into the PC region 103 in the first exemplary embodiment has a limit in the controllable phase range. Generally, the range is about from 0 to 6π. Further, if a large phase variation is required, the current injection into the PC region 103 becomes larger. Therefore, a carrier-plasma loss increases, resulting in a problem of high-output.

Figure 4:
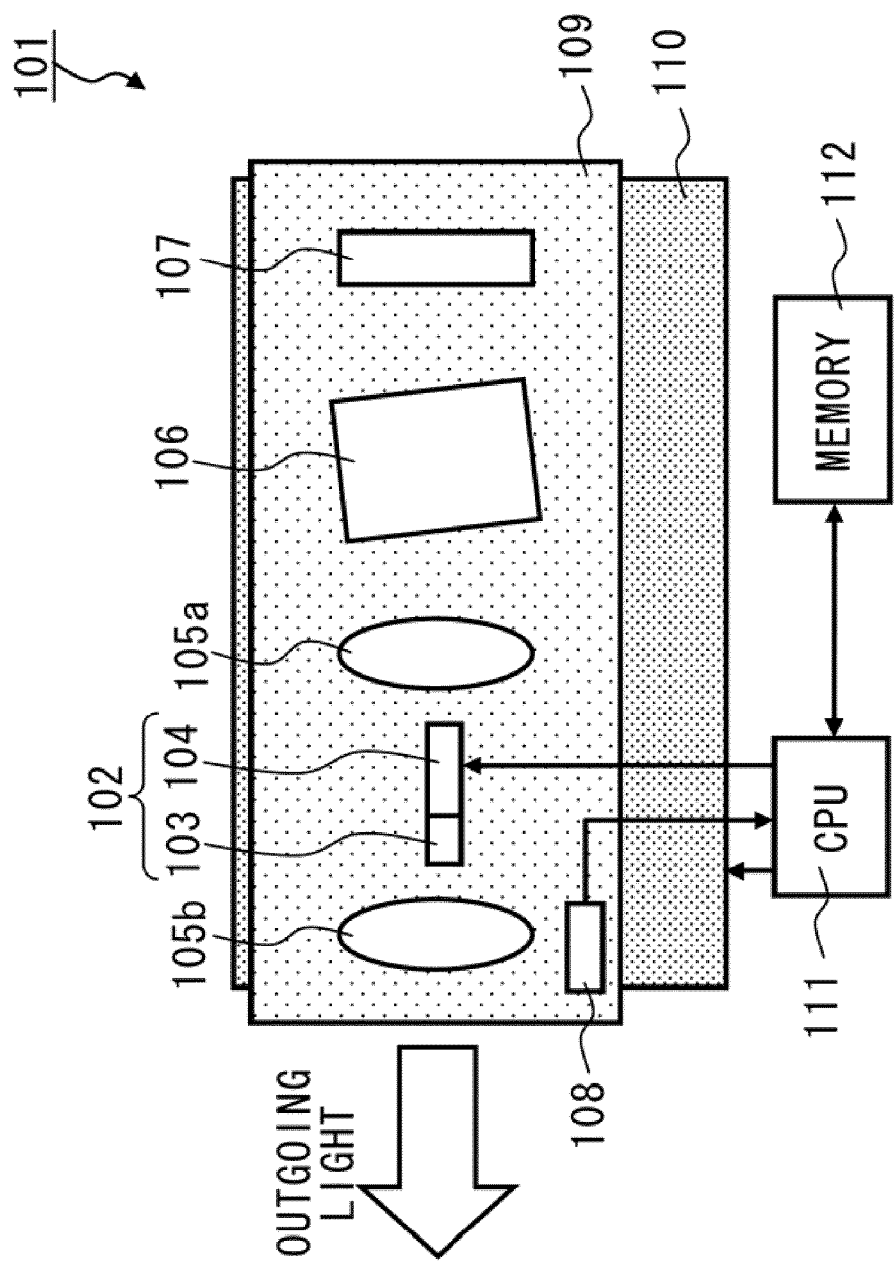
FIG. 4 shows a block diagram of a wavelength-tunable laser apparatus according to a second exemplary embodiment of the present invention.

To solve the above-mentioned problem, there is provided a method in which a phase in normal operating state is controlled by the PC current and a phase control function is achieved by adjusting the temperature of the SOA 102 when a wavelength is changed. A configuration like described above is shown in FIG. 4 as a second exemplary embodiment.

The SOA 102 including the PC region 103 and the amplification region 104, the pair of collimate lenses 105a and 105b, the etalon filter 106, the LC mirror 107, and the temperature detector 108 serving as a the thermistor are loaded onto the sub-carrier 109 in the wavelength-tunable laser apparatus 101 according to the second exemplary embodiment, as with the first exemplary embodiment. Further, the sub-carrier 109 is loaded onto the temperature controller 110 serving as a Peltier device.

In the second exemplary embodiment, unlike the first exemplary embodiment, the temperature of the SOA 102 is adjusted by the temperature detector 108 and the temperature controller 110 described above, to thereby perform phase control. An operating temperature TON and a temperature TOFF when a wavelength is changed are recorded in the memory 112, and a configuration is adopted in which the temperature of the SOA 102 is controlled under the open-loop control when the wavelength is changed.

Further, a temperature variation value ΔTSOA associated with an increase and decrease in the current of the SOA 102 can be estimated from a phase variation value due to thermo-optic effect in the SOA 102 and a temperature-characteristic of the SOA 102 itself. TOFF is represented by TON+ΔTSOA. This time, the temperature TON in operating state is set at 30 degrees Celsius where both low electricity consumption and a high-output characteristic can be satisfied.

Figure 5:
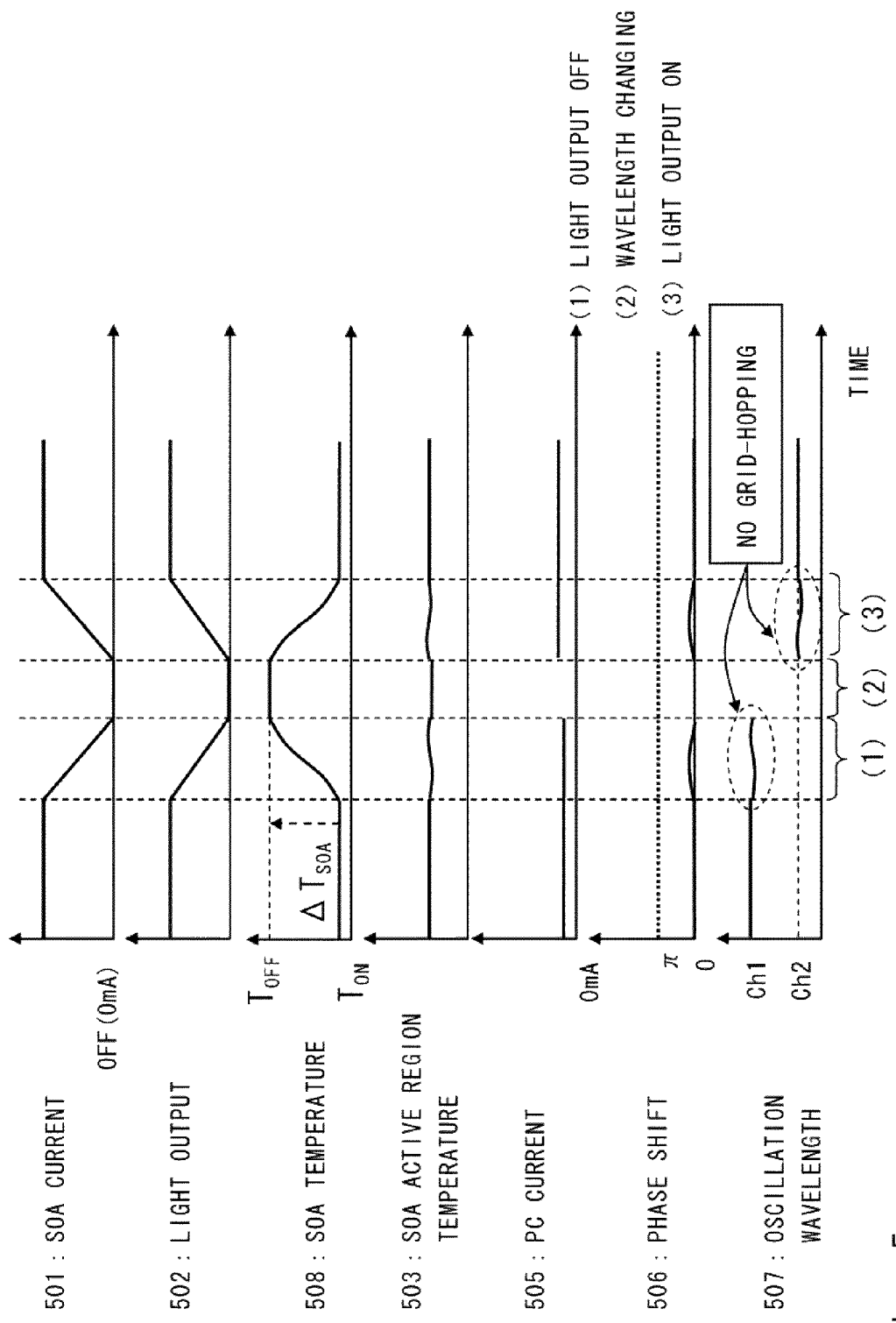
FIG. 5 is a graph showing changes of various parameters when a wavelength is changed in the wavelength-tunable laser apparatus according to the second exemplary embodiment of the present invention.

An operation according to the present exemplary embodiment will be described below with reference to FIG. 5. FIG. 5 is a graph showing a time-variation comparison among an SOA current 501, a light output 502, an SOA active layer temperature 503, a PC current 305, a phase shift 506, an oscillation wavelength 507, and an SOA temperature 508 on the same time axis when the wavelength is changed. Here, the SOA current 501 and the light output 502 in FIG. 5 correspond to the SOA current 301 and the light output 302 in FIG. 3, respectively.

A flow when the wavelength is changed from the channel-1 to the channel-2 using a phase-compensation by adjusting the temperature of the SOA 102 will be described below.

(1) Decreasing the Light Output -> OFF

The temperature 508 of the sub-carrier 109, or the SOA 102, is increased by ΔTSOA, from TON to TOFF. The phase is compensated for by decreasing the PC current 501 according to the temperature variation, and the light output 502 is turned off (2) Wavelength Setting The peak reflection wavelength of the LC mirror and a phase due to the PC current 505 is controlled.

(3) Increasing the Light Output -> ON

The temperature 508 of the sub-carrier 109, or the SOA 102, is decreased from TOFF to TON. The light output 502 is turned on with the phase-compensation by increasing the SOA current 501 according to the temperature variation.

A temperature variation when (1) the light output is turned off and (3) the light output is turned on is set so as to change linearly in 3 seconds and be thereafter stabilized by optimization of a temperature control by a Peltier device so as to achieve a phase-compensation of the SOA current 501 according to the variation of the SOA temperature 508. Then, a time control is executed by the CPU 111 so as to make the SOA current 501 change in 3 seconds.

The above-mentioned flow makes it possible to control the SOA active layer temperature 503 to be substantially constant when the wavelength is changed. Therefore, the phase shift 506 can be decreased to $\pi/2$ or less. Thus, the grid-hopping of the oscillation wavelength 307 can be prevented. Further, in FIG. 5, the PC current 505 of each channel in operating state at 30 degrees Celsius is set as a relatively low current in a range of 1 mA to 3 mA. Thus, the light output 502 becomes 13 dBm or more when the SOA current 501 is 200 mA, thereby achieving a high-output operation.

However, a method of adjusting the SOA current and information recoded in the memory 112 are not limited to the method of this time. For example, a time variation of the SOA current may be preliminarily evaluated so as to minimize the phase shift, and a time profile thereof may be recorded and used in the memory 112.

Further, while the PC current adjustment and temperature adjustment are used as a phase-compensation method according to the present invention, a phase-compensation can be performed by using other parameters. For example, a phase-compensation can be performed by using a MEMS or a piezoelectric element. However, even by these methods, a usable phase range is still limited.

Therefore, it is conceivable a combination use of phase controls (hybrid-like use) in which the phase control is performed by the PC current in normal operating state and by temperature when the wavelength is changed is most effective. Further, the method using the phase-compensation by temperature at this time can maintain a phase current to be used at a sufficiently low value. Thus, there is an advantage in achieving high-output. Additionally, the present invention can also be applied to other wavelength-tunable lasers, like a DBR laser.

As explained above, it is possible to provide a semiconductor device achieving a module that prevents a grid-hopping by concurrently controlling the phase and the SOA current when the wavelength of the wavelength-tunable laser is changed, according to the present invention. Further, it is possible to achieve a small module by using a current control in the PC regions integrated in the SOA as a phase control.

Furthermore, a PC current control is used as a phase control in operating state and an SOA temperature adjusting control is used as a phase control when the wavelength is changed. Thus, it is possible to provide a semiconductor device achieving a small module and a high-output characteristic with a little loss in the PC regions.

This application is the National Phase of PCT/JP2008/072298, filed Dec. 9, 2008, which is based upon and claims the benefit of priority from Japanese patent application No. 2008-34536, filed on Feb. 15, 2008, the disclosure of which is incorporated herein in its entirety by reference.

INDUSTRIAL APPLICABILITY

The present invention can be applied to an optical communication and light measurement apparatus.

The invention claimed is:

1. A wavelength changing method of a wavelength tunable laser apparatus comprising:
    decreasing a light output by concurrently controlling a current applied to a semiconductor optical amplifier and a phase tuning of a wavelength tunable laser under an open-loop control;
    changing a wavelength by controlling a current applied to a phase control region formed in the semiconductor optical amplifier; and
    increasing the light output by concurrently controlling the current applied to the semiconductor optical amplifier and the phase tuning of the wavelength tunable laser under the open-loop control.

2. The wavelength changing method of a wavelength tunable laser apparatus according to claim 1, wherein the phase is controlled by controlling a current applied to the phase control region when the light output decreases or increases.

3. The wavelength changing method of a wavelength tunable laser apparatus according to claim 1, wherein the phase is controlled by controlling temperature of the semiconductor optical amplifier when the light output decreases or increases.

* * * * *